United States Patent [19]
Yamazaki et al.

[11] Patent Number: 5,545,571
[45] Date of Patent: Aug. 13, 1996

[54] METHOD OF MAKING TFT WITH ANODIC OXIDATION PROCESS USING POSITIVE AND NEGATIVE VOLTAGES

[75] Inventors: Shunpei Yamazaki, Tokyo; Hongyong Zhang, Kanagawa; Hideki Uochi, Kanagawa; Hiroki Adachi, Kanagawa; Yasuhiko Takemura, Kanagawa, all of Japan

[73] Assignee: Semiconductor Energy Laboratory Co., Ltd., Atsugi, Japan

[21] Appl. No.: 43,782

[22] Filed: Apr. 6, 1993

Related U.S. Application Data

[63] Continuation-in-part of Ser. No. 933,810, Aug. 24, 1992, Pat. No. 5,308,998.

[30] Foreign Application Priority Data

| Apr. 7, 1992 | [JP] | Japan | 4-115503 |
| Mar. 24, 1993 | [JP] | Japan | 5-089117 |

[51] Int. Cl.⁶ .................................................. H01L 21/84
[52] U.S. Cl. .............................. 437/21; 437/41; 437/174; 437/170; 437/172; 205/91; 205/106; 205/324
[58] Field of Search ............................ 205/81, 106, 107, 205/324; 437/21, 71, 41, 101, 909, 245, 246

[56] References Cited

U.S. PATENT DOCUMENTS

| 3,862,017 | 1/1975 | Tsunemitsu et al. | 205/124 |
| 5,132,200 | 7/1992 | Fukuda et al. | 430/131 |
| 5,202,274 | 4/1993 | Bae et al. | 437/40 |
| 5,308,998 | 5/1994 | Yamazaki et al. | 257/57 |

Primary Examiner—George Fourson
Assistant Examiner—Richard A. Booth
Attorney, Agent, or Firm—Sixbey, Friedman, Leedom & Ferguson, P.C.; Gerald J. Ferguson, Jr.; Eric J. Robinson

[57] ABSTRACT

An improved method for manufacturing an insulated gate field effect transistor is described. The method comprises the steps of forming a semiconductor film on an insulating substrate, forming a gate insulating film on said semiconductor film, forming a gate electrode on said gate insulating film with said gate insulating film inbetween, anoding said gate electrode in order to coat an external surface of said gate electrode with an oxide film thereof and applying a negative or positive voltage to said gate electrode with respect to said semiconductor film. Lattice defects and interfacial states caused by the application of a positive voltage during the anoding are effectively eliminated by the negative voltage application.

18 Claims, 11 Drawing Sheets

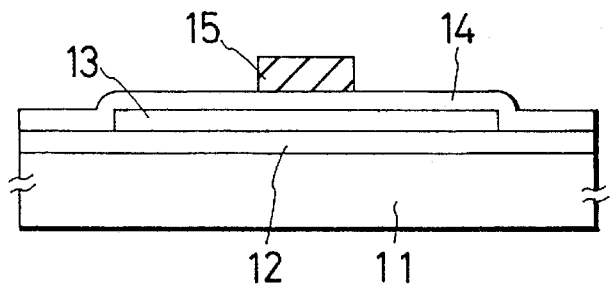
FIG.6(A)
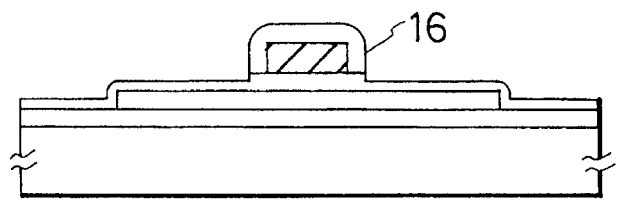
FIG.6(B)
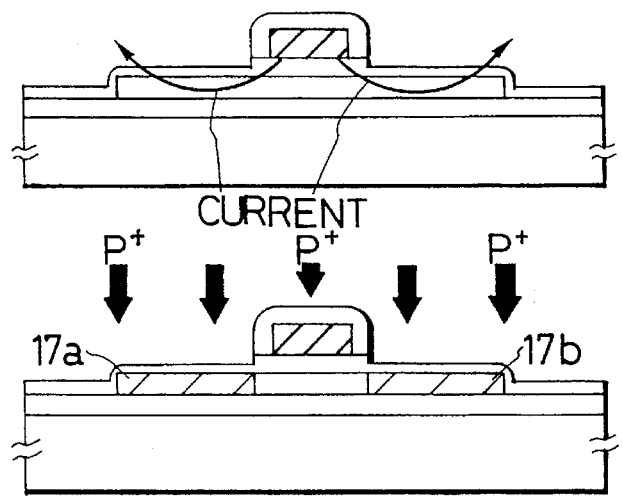
FIG.6(C)
FIG.6(D)
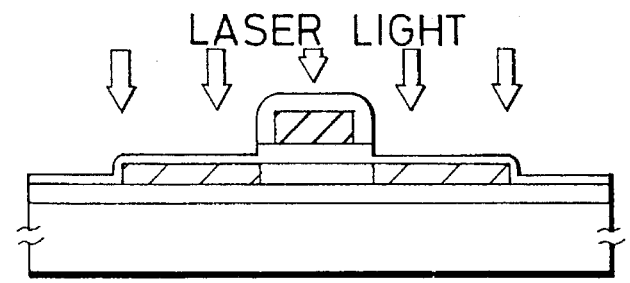
FIG.6(E)
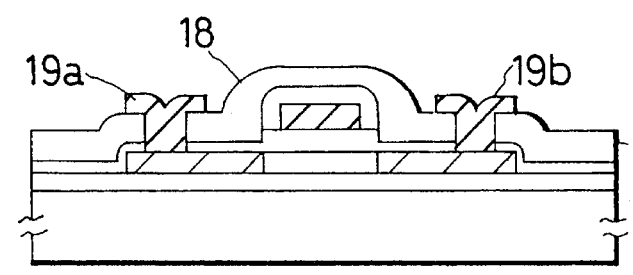
FIG.6(F)

1

METHOD OF MAKING TFT WITH ANODIC OXIDATION PROCESS USING POSITIVE AND NEGATIVE VOLTAGES

This application is a continuation-in-part of Ser. No. 933,810 filed Aug. 24, 1992 now U.S. Pat. No. 5,308,998.

BACKGROUND OF THE INVENTION

1. Field of the Invention

The present invention relates to a method for forming a semiconductor device and, in particular, to a method of manufacturing thin film insulated gate field effect transistors. The thin film transistor can be formed on both an insulating substrate like glass and a semiconductor substrate of single crystal silicon and the like.

2. Description of the Prior Art

Recently, an insulated gate type semiconductor device with a thin film active layer(active region) is studied. Especially a thin film insulated gate transistor, what is called thin film transistor is studied enthusiastically. These are defined as amorphous silicon TFT, crystal silicon TFT, on the basis of material.crystal condition of semiconductor utilized.

Crystal semiconductor has bigger field mobility than that of amorphous semiconductor, and is operated at a high speed. Not only NMOS TFT but also PMOS TFT can be obtained from crystal silicon. Because a CMOS circuit can be formed, a TFT utilizing crystal silicon is studied enthusiastically especially now.

According to achievement until now, in forming an insulated gate device like this, the most appropriate characteristic is obtained by the gate insulating film of a silicon thermal oxidation film. However, it is necessary to heat the film approximately at 1000° C. to obtain the thermal oxidation film. At a temperature like this, substrate material utilized is limited. In forming a TFT like this, an insulating film formed by sputtering and various kinds of chemical vapor deposition(CVD) has been utilized.

Because temperature as high as this is not needed for forming such insulating film as this, restrictions to the substrate is removed. On the other hand, it is problematic that such insulating film formed by this gas phase deposition method has high interface state density and many defects such as pin holes. Concerning repair of such defects and improvement of characteristic, no treatment was done after deposition, and as a matter of fact, mainly solved by making the deposition condition most appropriate.

Recently, researchers interests have been directed to improvement of thin film insulated gate field effect transistors (TFT). For example, it has been proposed in Japanese Patent Application No.Hei4-30220 or Japanese Patent Application No.Hei4-38637 of the same applicants to make the gate electrode from Al, Ti, Cr, Ta or Si and coat the external surface of the gate electrode with oxide films thereof. The source and drain regions of the device are formed by ion implantation with the anoded gate electrode as a mask so that they are located set back from the edge of the gate electrode to provide a so-called offset structure therebetween. The source and drain regions of the device are then laser annealed to recrystallize the same.

The transistors having such an offset structure exhibit excellent characteristics as compared with those having gate electrodes of silicon, tantalum or chromium manufactured without the offset structure. The reproducibility, however, is not so high in this case utilizing the offset structure. The reason for such a low reproducibility is application of a high voltage to the gate electrode during anoding to subject the semiconductor region under a high electric field so that trapping energy states are generated in the semiconductor regions. Although no voltage is particularly applied to the semiconductor region, a voltage of 20 to 150 V is created thereacross due to influence of the high voltage applied to the gate electrode.

This problematic situation will be explained with reference to FIG. 1(A) showing a cross sectional view of a prior art transistor. The transistor comprises a glass substrate 101, a semiconductor film 102 formed on the substrate 101, a gate electrode 104 formed on the semiconductor film 102 through a gate insulating film 103 and an aluminum oxide film 105 formed by anoding of the gate electrode 104 made of aluminum to cover the gate electrode 104. The anoding is carried out by applying a high positive voltage to the gate electrode 104 in an electrolyte which is grounded through a suitable electrode. First, the electric field is caused mainly in the electrolyte around the gate electrode when the anoding is just initiated. The voltage across the semiconductor film 102 is not so high in this stage. When the thickness of the oxide film becomes thick, however, the electric field is concentrated to the oxide film and therefore the voltage across the gate insulating film is increased and causes injection of electrons into the gate insulating film 106 just under the gate electrode 104.

The thickness of the oxide film 105 is, for example, 300 to 400 nm when formed in accordance with the method as described in Japanese Patent Application No. Hei4-30220 or Japanese Patent Application No. Hei4-38637. The thickness of the gate insulating film 103 is, for example, 100 nm. The electric field in the gate insulating film 103 then exceeds the electric field across the aluminum oxide film 105 in this case, assuming that the resistivity of silicon oxide and the resistivity of aluminum oxide are equal to each other, even if the semiconductor region 102 under the gate insulating film 103 is intrinsic and has a certain resistivity to generate a voltage drop thereacross. Because of such a high electric field, the anoding can no longer be continued without damage to the gate insulating film 103.

Furthermore, since an underlying insulating film such as a silicon oxide film is formed between the glass substrate 101 and the semiconductor film 102 in order to prevent undesirable influence of the glass substrate on the semiconductor film 102, particular attention must be paid for formation of the underlying silicon oxide film and the semiconductor films. For example, the silicon oxide film must be formed in order not to contain movable ions. More destructive is existence of trapping states. The elimination of movable ions can be performed to some extent by making the process clean. It is, however, impossible to substantially solve the problem associated with trapping states because the problem originates from the general restriction to the process. The density of interfacial states between the silicon oxide film 103 and the underlying semiconductor films 104 is an important factor which dictates the characteristics of the transistors. In the case of the MOS technique on single crystalline semiconductor substrates, the interfacial state density between the single crystalline semiconductor and a gate oxide film formed on the semiconductor by thermal oxidation is of the order of $10^{10}$ $cm^{-2}$. On the other hand, since a corresponding semiconductor is deposited in the form of a polycrystalline silicon on an oxide film formed by plasma CVD, atmospheric pressure CVD or low pressure CVD in the case of the thin film transistors, the interfacial state density is as high as $10^{12} cm^{-2}$ or higher. This density is too high to put the transistors into practical use. Namely, if the interfacial state density is so high, several carriers are trapped at the interface and determine the conductivity type of the semiconductor regions irrespective of the gate voltage to increase current leakage therethrough. Accordingly, the underlying silicon oxide film must be formed with such a high quality as required in the case of the gate insulating film. In the case that a silicon oxide film is formed by sputtering or ECR plasma CVD, which is employed in low or intermediate temperature processes where thermal oxidation is not available, the interfacial state density is higher than that in the case of thermal oxidation by about one order of magnitude and therefore a similar problem is inevitable.

BRIEF SUMMARY OF THE INVENTION

It is an object of the present invention to provide a method of manufacturing improved thin film insulated gate field effect transistors.

It is another object of the present invention to provide a method of manufacturing improved thin film insulated gate field effect transistors with an increased yield.

It is a further object of the present invention to provide a method of manufacturing improved thin film insulated gate field effect transistors having highly reliable gate insulating film.

It is a still further object of the present invention to provide a method of manufacturing improved thin film insulated gate field effect transistors wherein trapped electrons and lattice defects are eliminated from the gate insulating films.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a method for manufacturing an insulated gate field effect transistor comprises the steps of forming a semiconductor film on an insulating substrate, forming a gate insulating film on said semiconductor film, forming a gate electrode on said gate insulating film with said gate insulating film inbetween, anoding said gate electrode in order to coat an external surface of said gate electrode with an oxide film thereof and applying a negative voltage to said gate electrode with respect to said semiconductor film. Lattice defects and interfacial states caused by the application of a positive voltage during the anoding are effectively eliminated by the negative voltage application as described hereinbelow in details.

The fundamental mechanism of the present invention will be explained with reference to FIGS. 1(B) to 1(E) showing the energy band structure in response to the voltage applied to the gate electrode. The voltage level of the gate electrode is very high during the anoding so that the energy level is very low to generate a high electric field across the gate insulating film as illustrated in FIG. 1(B). Electrons collide with the gate insulating film by the high electric field, generate lattice defects and are trapped in the gate insulating film, particularly at the interface between the semiconductor region and the gate insulating film. The trapping of electrons and the generation of lattice defects are significant when the gate insulating film is made of silicon nitride.

The electrons trapped and the lattice defects remain even after the removal of the high voltage from the gate electrode as illustrated in FIG. 1(C). The characteristics of the channel of the transistor are substantially influenced by the trapped electrons. For example, if the device is a p-channel transistor, the semiconductor region just under the gate insulating film, i.e. the channel region is converted to a p-type region to allow current leakage therethrough. If the device is an n-channel transistor, the threshold voltage is shifted to the positive direction.

In accordance with the present invention, a negative voltage is applied to the gate electrode after the anoding in order to generate a reverse electric field across the gate insulating film. The electrons trapped in the gate insulating film are discharged by the negative voltage as illustrated in FIG. 1(D). The lattice defects are neutralized by holes introduced by the negative voltage at the same time. By this procedure, the normal condition of the energy band structure is resumed after the negative voltage is removed as illustrated in FIG. 1(E). The anoding followed by the application of the negative voltage may be repeated for several times if desired. In this case, the damage of the semiconductor region and the gate insulating film due to the application of the positive voltage application is cured by the negative voltage application before the damage becomes too serious to substantially remedy.

The application of the negative voltage can be carried out in the electrolyte in which the gate electrode is anodic oxidized. In this case, all the semiconductor regions are electrically connected with each other to the cathode through the electrolyte and therefore there is no need for forming particular wiring provided to connect the semiconductor region. Alternatively, the application of the negative voltage can be carried out after the substrate is removed from the electrolyte. In this case, however, when a plurality of separate semiconductor regions are formed on the substrate, the semiconductor regions must be integrally connected to a positive level respective to the gate electrode by a particular connection means, e.g., a three-dimensional wiring, during the application of the negative voltage. Accordingly, it is preferred to carry out the application of the negative voltage in the electrolyte from the view point of the production cost and the yield. Furthermore, if the negative voltage is applied to the gate electrode in the electrolyte, hydrogen ions are introduced into the semiconductor region and the gate insulating film. The hydrogen ions serve to reduce lattice defects, for example, by terminating dangling bonds.

In accordance with the preferred embodiment of the present invention, since the gate electrode is maintained at a negative voltage in an electrolyte, the electrolyte tends to reduce the anoded oxide film and dissolve the gate electrode. The gate electrode is, therefore, preferably formed of aluminum, titanium, tantalum and so on having a sufficient resistance to the reducing action, but not formed of copper, zinc, silver and so on which are easily reduced. In the cases utilizing the latter type of the metals for forming the gate electrode, the negative voltage will be applied outside of the electrolyte.

In other methods of the present invention, while voltage $V_{CG}$ to be applied to a gate insulating film under a gate electrode is kept to be at an appropriate value, current cure is performed. $V_{CG}$ is 30–80 V, for example.

In the study of this inventor, it was found that characteristics of a TFT was extremely improved when positive or negative voltage is applied between a gate electrode and a semiconductor layer. This effect is called as current cure or current anneal hereinafter. Concerning the voltage to be applied, not both types of voltage can make the effect of current cure. For example, in the case of an N channel TFT(source, drain is N type), it is necessary to apply positive voltage to a gate electrode. In the case of a P channel TFT(source, drain is P type), it was preferable to apply negative voltage to a gate electrode.

This current cure effect was produced by two incidents. One was when an electrochemical effect buried pinholes of an oxide film. This was a phenomenon of ions moving (mainly oxygen ions) in the gate insulating film. If the thickness of the gate insulating film was ununiform, the ions moved by voltage applied so as to smoothen ununiform portions. As a result, uniformity of the gate insulating film in the TFT was improved.

The other was heating by current, which caused actually the same effect as that of annealing at a high temperature. In this state, fixed charge was removed, dangling bonds of ions and silicon were connected with each other, and density of interface state was decreased. Such effect as this needed high temperature of approximately 1000° C. on the whole substrate, but current cure was performed to the whole substrate at a room temperature or in a cooled liquid. However, in a small scale, treatment of energy corresponding to 1000° C.(approximately 0.1 eV) was performed to a minute region of the gate insulating film.

FIG. 10 shows a condition when source, drain of a TFT is in the same voltage, and voltage is charged between this and a gate electrode.(FIGS. 10(A)–(D)) FIGS. 10(A) and (C) show an energy band diagram at A-A' in FIG. 5(A). FIGS. 10(B) and (D) show an energy band diagram at B-B' in FIG. 5(A). Source, drain is not doped, and is intrinsic like the active region under the gate electrode. FIGS. 10(A) and (B) show a gate electrode to which positive voltage is applied. FIGS. 10(C) and (D) show a gate electrode to which negative voltage is applied. In both cases, the band is steeply twisted near the gate electrode and the gate insulating film by the effect of applied voltage, and a deep inversion is formed near silicon of an interface between silicon oxide and silicon. Electrons and holes are accelerated at a steep portion of an energy band as is shown in FIGS. 10(A) and (C), and recombinate with each other through recombination centers. Then they lose kinetic energy by this recombination, and locally emit light and dangling bonds are then recombinated with each other, or are neutralized. As is shown in FIGS. 10(B) and (D), electrons or holes are smashed into the gate insulating film from a portion inside a semiconductor through the interface with high energy. These electrons and holes collide with a lattice and generate a lot of local heat.

This effect was clearly confirmed experimentally, but was extremely difficult to be performed on a mass production basis. One problem was how to apply voltage to the semiconductor region and the gate electrode.

In an experiment, the gate electrode and the semiconductor region are connected with electric wires, respectively. On a mass production basis, such method cannot be used. Concerning this problem, this inventor hit the idea of using an electrolytic solution of a room temperature or cooled one. This solution also functions as a cool sink(cooling medium) which prevents excessive local heating and permanent breakdown. The operation is briefly explained as follows. FIG. 5(A) shows a TFT element. This TFT is formed on a substrate 1 and a base insulating film 2, and comprises an island semiconductor region 3, a gate insulating film 4, and a gate electrode 5. An insulating film 6 is provided on the gate electrode 5. This insulating film 6 is extremely important in using an electrolyte. It is usually preferable for this insulating film 6 to be an oxide film obtained by performing anodic oxidation to the gate electrode.

Though in the figure just a TFT is shown, many TFTs exist independent of each other on the same substrate. Electric potential difference is produced between the upper portion and the lower portion of the gate insulating film by applying voltage to the gate electrode. Current cure is performed in this way.

An equivalent circuit of a TFT as this is shown in FIG. 5(B). Electric potential of the gate electrode is $V_G$. Looked from the gate electrode, there are two routes: one is a route through the insulating film 6(resistance $R_1$) reaching the electrolyte; the other is a route through the gate insulating film 4 (resistance $R_2$) under the gate electrode, the semiconductor region 3(resistance $R_4$), the gate insulating film 4(resistance $R_3$) again, reaching the electrolyte. It is clear the value of voltage $V_{CG}$ applied to the gate insulating film under the gate electrode is optimized by controlling this resistance $R_1$, $R_2$, $R_3$, and $R_4$.

If the insulating film 6 does not exist, $R_1=0$. Because $R_1=0$, $V_{CG}=0$, which means voltage will not be applied to the gate insulating film. Therefore it is necessary that the insulating film 6 exists. As is apparent from the circuit, if $R_1<R_2+R_3+R_4$, $V_{CG}$ becomes smaller than the voltage applied to the insulating film 6. It is known from an experiment that 30–80 V is needed for $V_{CG}$. To obtain such big voltage, it is desirable to increase $R_1$ and to decrease $R_3$.

To put it more concretely, the gate insulating film 4 provided on the semiconductor region 3 should be entirely made thin or a part or all of it should be removed, except the region under the gate electrode. For example, if the entire part is removed, $R_3=0$, and $V_{CG}$ increases a lot. It is also effective to make the insulating film 6 thick. As a result, effective current cure is performed without increasing voltage $V_G$ applied to the gate electrode so much. Positive voltage should be applied to an N channel type TFT, and negative voltage should be applied to a P channel type TFT.

If anodic oxide of material of a gate electrode is utilized as the insulating film 6, aluminum, tantalum, silicon, titanium, tungsten, chromium and the like should be utilized for a gate electrode. It is desirable to keep such electrolyte at a constant temperature to conduct reaction uniformly. Since the electrolytic solution has an ability of heat diffusion (cooling), breakdown caused by local excessive heat generation is prevented.

FIG. 11 shows a schematic view of an apparatus for performing current cure of the present invention. An electrolytic cell 7 is filled with electrolyte 8. A substrate 9 and an electrode 10 which is oxidation-resistant platinum, palladium and the like are dipped in the electrolyte 8. Concerning dipping of the substrate, there are two methods. One is a method of dipping it directly in the solution as in FIG. 11(A); the other is a method of dipping the substrate 9 in the solution by fixing it on a substrate supporting board 9A as in FIG. 11(B). Positive or negative voltage is applied to terminals A, B extending from these electrode and substrate.

BRIEF DESCRIPTION OF THE DRAWINGS

The accompanying drawings, which are incorporated in and form a part of the invention and, together with the description, serve to explain the principles of the invention.

FIGS. 6A to 6(F) are cross sectional view showing formation process of the fourth embodiment.

FIGS. 10(A) to 10(F) show band diagrams of current cure.

DETAILED DESCRIPTION OF THE PREFERRED EMBODIMENTS

Figure 1:
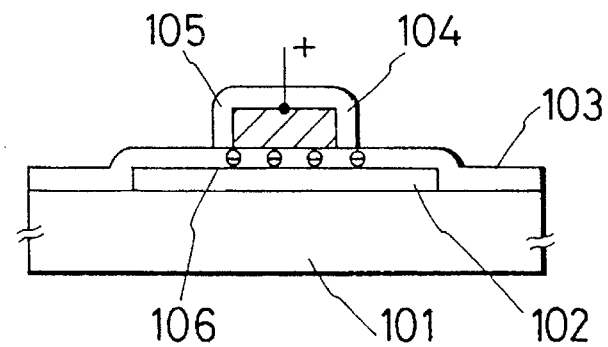
FIG. 1(A) is a cross sectional view showing a conventional prior art thin film insulated gate field effect transistor.
FIGS. 1(B) to 1(E) are schematic diagrams showing the energy band structure of a thin film insulated gate field effect transistor manufactured in accordance with the present invention.
Figure 1:
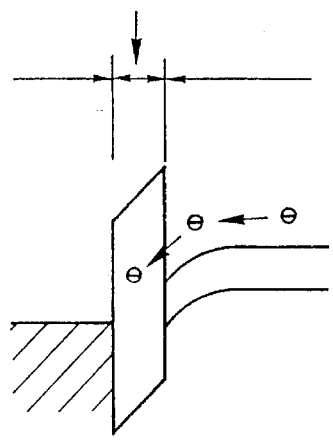
Figure 1:
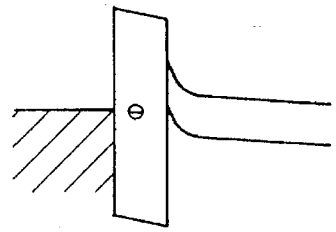
Figure 1:
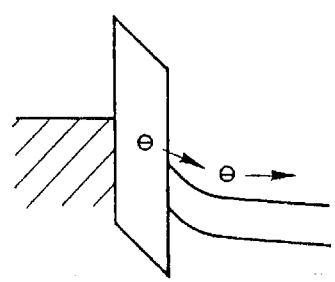
Figure 1:
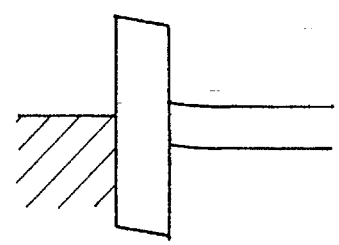

Referring now to FIGS. 2(A) to 2(D), a method of manufacturing complementary thin film insulated gate field effect transistors in accordance with a first embodiment of the present invention will be explained.

A non-expensive glass plate is used as a substrate 201. The glass plate is, for example, the N—O glass plate manufactured by Nippon Electric Glass Co., Ltd. The glass plate has a high distortion temperature but is rich in lithium and sodium. A silicon nitride film 202 is formed on the substrate for the purpose of blocking lithium and sodium ions. The silicon nitride film 202 is deposited to a thickness of 10 to 50 nm by plasma CVD. A silicon oxide film 203 is then formed in the same manner thereon to a thickness of 100 to 800 nm by sputtering. An amorphous semiconductor film is deposited on the silicon oxide film 203 to a thickness of 20 to 100 nm by plasma CVD. The semiconductor film is then recrystallized by thermal annealing at 600° C. for 12 to 72 hours and patterned into a plurality of semiconductor islands 204 and 205 by photolithography and reactive ion etching (RIE). A silicon oxide film 206 is deposited to a thickness of 50 to 200 nm by sputtering in oxygen with a target of silicon oxide. A silicon nitride film 207 is deposited in the same manner to a thickness of 2 to 20 nm, preferably 8 to 11 nm, by plasma CVD or low pressure CVD in order to form a dual gate insulating film together with the silicon oxide film 206. An aluminum film is formed on the silicon nitride film 207 by sputtering or electron beam evaporation and patterned by etching with a mixed acid prepared by adding a 5% nitric acid to phosphoric acid in order to form gate electrodes 209 and 210 and necessary wirings 208 and 211. By the above procedure, the indispensable elements of the transistors are provided on the substrate.

The external surfaces of the gate electrodes 209 and 210 and the wirings 208 and 211 are then anodic oxidized in order to form aluminum oxide films 212, 213, 214 and 215. Namely, the substrate is dipped in an electrolyte with the gate electrodes 209 and 210 and the wirings 208 and 211 as an anode together with a suitable electrode dipped as a cathode. The details of the anoding method are described in Japanese Patent Application No.Hei4-30220. The actual configuration of the anoding system and the procedure of anoding will be determined in accordance with the characteristics desired of the transistors, the process requirements, the investment scale and so forth. The application of the negative voltage to the gate electrodes 209 and 210 and the wirings 208 and 211 is carried out as follows in accordance with this embodiment of the present invention.

First, the voltage of the gate electrodes 209 and 210 and the wirings 208 and 211 are increased from 0 V to 300 V at the rate of 10 V per minute. When 300 V is applied to the gate electrodes 209 and 210 and the wirings 208 and 211, the condition is maintained for an hour in order to carry out anodic oxidation of the gate electrodes 209 and 210 and the wirings 208 and 211 to form the aluminum oxide films 212, 213, 214 and 215 of a thickness of 350 nm covering them. Next, the voltage of the gate electrodes 209 and 210 and the wirings 208 and 211 are decreased from 300 V to a negative voltage of −30 V to −100 V, preferably −35 V to −50 V, at the rate of 10 V per minute. The electrons trapped and the lattice defects caused during the anoding are then eliminated by the application of the negative voltage.

Figure 2A:
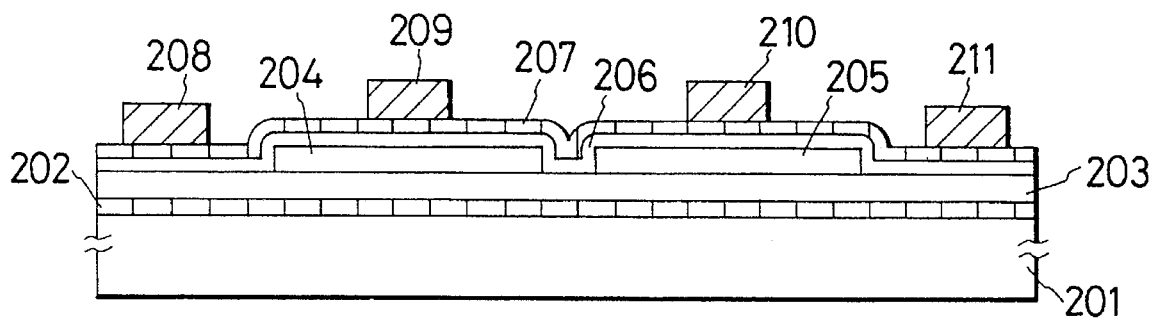
FIGS. 2(A) to 2(D) are cross sectional views showing a thin film insulated gate field effect transistor manufactured in accordance with a first embodiment of the present invention.
Figure 2B:
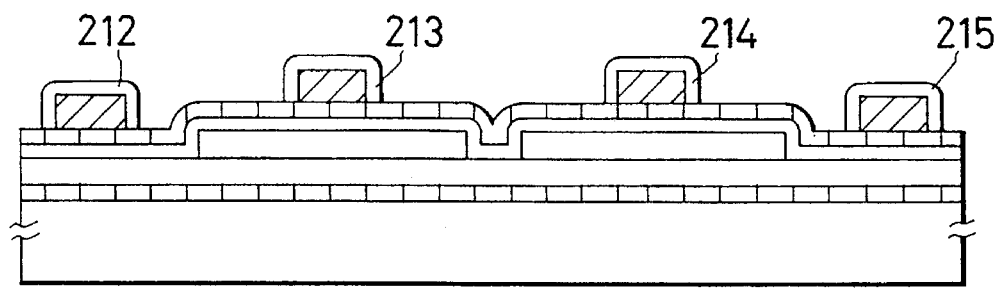
Figure 2C:
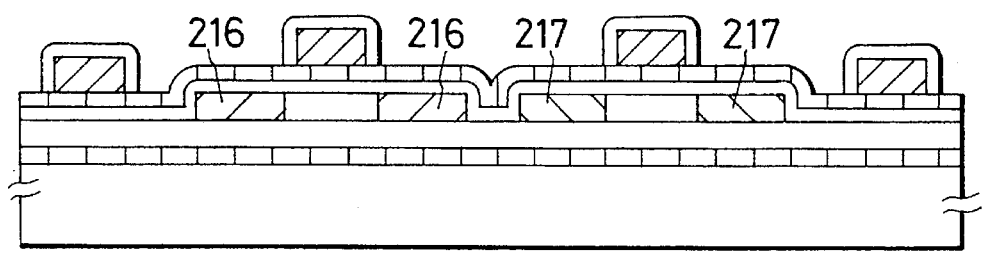
Figure 2D:
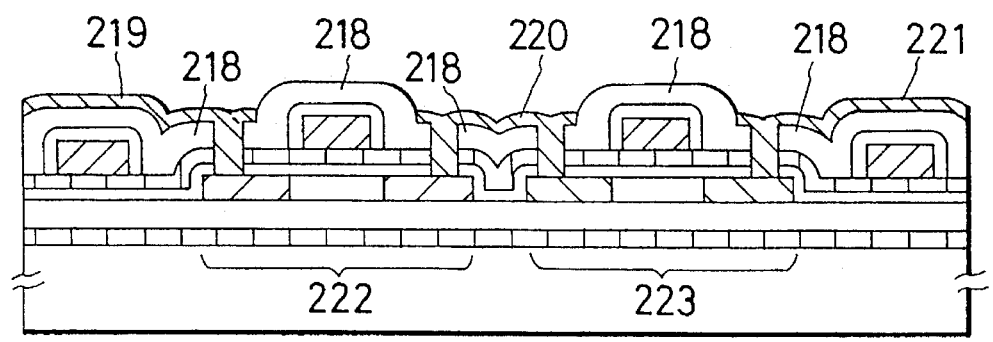

Next, source and drain regions 216 and 217 are formed within the semiconductor islands 204 and 205 by ion implantation in accordance with the known CMOS manufacturing technique. Namely, phosphorous ions are implanted into the semiconductor island 204 with 110 KeV while the gate electrode 209 and the aluminum oxide film 213 cover the middle portions of the semiconductor islands to be channel regions. Boron fluoride ions are implanted in the same manner into the semiconductor island 205 with 80 KeV. In the light of the aluminum oxide films 213 and 214, the source and drain regions 216 and 217 are formed a certain distance apart from the edge of the gate electrodes in the so-called offset structure as illustrated in FIG. 2(C).

Since, the crystallinity of the source and drain regions 216 and 217 is substantially damaged by the ion implantation to be substantially amorphous or polycrystalline close to amorphous, laser annealing is performed in order to recrystallize the source and drain regions. The condition of the laser annealing is described in Japanese Patent Application No.Hei4-30220. The laser annealing can be replaced by thermal annealing at 600° to 850° C. After the annealing, the substrate is annealed again in hydrogen (1 to 700 Torr, preferably 500 to 700 Torr) at 250° to 450° C. for 30 minutes to 3 hours. By this annealing in hydrogen, hydrogen atoms are introduced into the semiconductor regions and reduce lattice defects such as dangling bonds by termination.

The structure is then coated with a silicon oxide interlayer film 218 deposited by sputtering. Appropriate contact holes are opened through the silicon oxide film 218, the silicon nitride film 207 and the silicon oxide film 206 by photolithography to expose the source and drain regions 216 and 217. Finally, necessary wirings including source and drain electrodes 220 are formed in contact with the source and drain regions 216 and 217 through the contact holes by depositing and patterning an aluminum or chromium film.

Referring now to FIGS. 3(A) to 3(D), a method of manufacturing complementary thin film insulated gate field effect transistors in accordance with a second embodiment of the present invention will be explained.

A non-expensive glass plate is used as a substrate 301. The glass plate is, for example, made of Corning 7059 manufactured by Corning Co., Ltd. A silicon nitride film 302 is formed on the substrate for the purpose of blocking movable ions. The silicon nitride film 302 is deposited to a thickness of 5 to 200 nm, for example, 10 nm by RF plasma CVD. A silicon oxide film 303 is then formed in the same manner thereon to a thickness of 200 to 1000 nm, for example, 50 nm by RF plasma CVD. The thicknesses of the silicon nitride film 302 and the silicon oxide film 303 are determined taking into account the tendency of movable ions to penetrate therethrough and the influence upon a semiconductor film to be deposited thereon in a later step. Of course these films 302 and 303 can be deposited by other deposition techniques such as low pressure CVD, sputtering or the like in accordance with the scale of investment, the efficiency of massproduction and so forth. These films 302 and 303 may be continuously deposited in the same chamber.

Figure 3A:
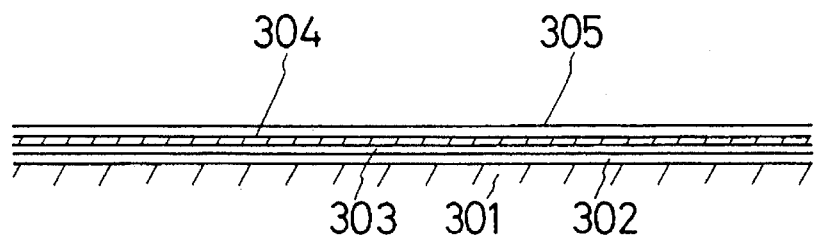
FIGS. 3(A) to 3(D) are cross sectional views showing a thin film insulated gate field effect transistor manufactured in accordance with a second embodiment of the present invention.

A first amorphous semiconductor film 304 is deposited on the silicon oxide film 303 to a thickness of 20 to 200 nm, for example, 100 nm by low pressure CVD with a reactive gas consisting of monosilane at a substrate temperature of 430° to 480° C., for example, 450° C. The deposition is continued at a different substrate temperature of 520° to 580° C., for example, at 550° C. in order to form a second amorphous semiconductor film 305 to a thickness of 5 to 200 nm, for example, 10 nm on the first semiconductor film 304 as illustrated in FIG. 3(A). It has been confirmed through research conducted by the inventors that the substrate temperature substantially influences the progress of the following recrystallization of the semiconductor films. For example, when the semiconductor film was deposited at no higher than 480° C., it was difficult to recrystallize it. On the contrary, when deposited at no lower than 520° C., the recrystallization was easily performed.

Figure 3B:
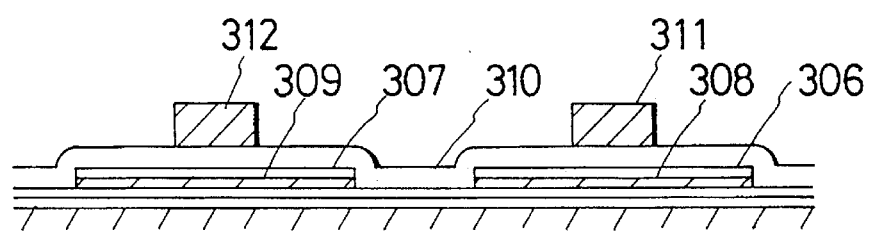

The semiconductor film 305 is then recrystallized by thermal annealing at 600° C. for 24 hours to transform it into a so-called semi-amorphous semiconductor film. The underlying semiconductor film 304, however, remains amorphous. In order to effectively perform the recrystallization of the semiconductor film 305, the densities of carbon atoms, nitrogen atoms and oxygen atoms occurring in the semiconductor film 305 are preferably no higher than $7\times10^{19}cm^{-3}$ respectively. In accordance with experiments, the densities were measured respectively to be no higher than $1\times10^{17}cm^{-3}$. These semiconductor films 304 and 305 are then patterned into a plurality of semiconductor islands 306 and 307 by photolithography and etching. The upper film of each semiconductor island is then composed substantially of an intrinsic semiconductor. A silicon oxide film 310 is deposited to a thickness of 50 to 300 nm, for example, 150 nm by sputtering in oxygen with a target of silicon oxide in order to form a gate insulating film. An aluminum film is formed on the silicon oxide film 310 by sputtering or electron beam evaporation and patterned by etching with a mixed acid prepared by adding a 5% nitric acid to phosphoric acid in order to form gate electrodes 311 and 312 and necessary wirings not shown in the figure. The etching rate is 225 mm/min at 40° C. The gate electrodes are then formed to define a channel length of 8 micrometers and a channel width of 20 micrometers in the underlying semiconductor islands 306 and 307 as illustrated in FIG. 3(B).

The external surfaces of the gate electrodes 311 and 312 and the wirings are then anodic oxidized in order to form aluminum oxide films 313 and 314. Namely, the substrate is dipped in an electrolyte with the gate electrodes 311 and 312 and the wirings as an anode together with a suitable electrode dipped as a cathode. The details of the anoding method are described in Japanese Patent Application No.Hei3-231188 or Japanese Patent Application No. Hei3-238713. The actual configuration of the anoding system and the procedure of anoding will be determined in accordance with the characteristics desired of the transistors, the process requirements, the investment scale and so forth. The application of the negative voltage to the gate electrodes 311 and 312 and the wirings is carried out as follows in accordance with this embodiment of the present invention.

First, the voltage of the gate electrodes 311 and 312 and the wirings are increased from 0 V to 300 V at the rate of 10 V per minute. When 300 V is applied to the gate electrodes 311 and 312 and the wirings, the condition is maintained for an hour in order to carry out anodic oxidation of the gate electrodes 311 and 312 and the wirings to form the aluminum oxide films 313 and 314 of a thickness of 350 nm covering them. Next, the voltage of the gate electrodes 311 and 312 and the wirings are decreased from 300 V to a negative voltage of −30 V to −100 V, preferably −35 V to −50 V, at the rate of 10 V per minute. The electrons trapped and the lattice defects caused during the anoding are then eliminated by the application of the negative voltage.

Figure 3C:
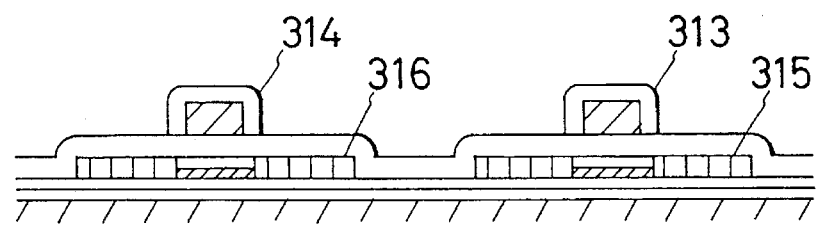
Figure 3D:
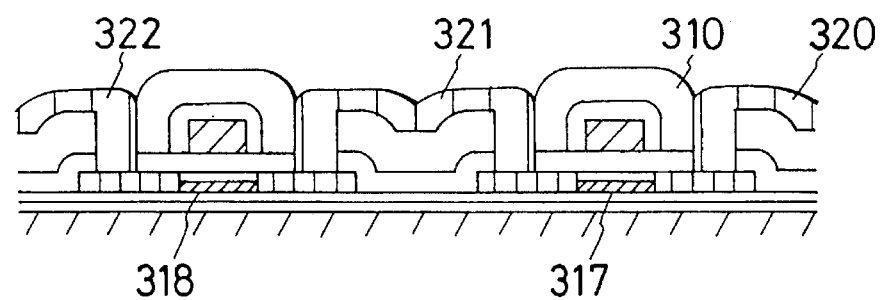

Next, source and drain regions 315 and 316 are formed within the semiconductor islands 306 and 307 by ion implantation in accordance with the known CMOS manufacturing technique. Namely, phosphorous ions are implanted into the semiconductor island 308 with 110 KeV while the gate electrode 311 and the aluminum oxide film 313 cover the middle portions of the semiconductor islands to be channel regions. Boron fluoride ions are implanted in the same manner into the semiconductor island 307 with 80 KeV. In the light of the aluminum oxide films 313 and 314, the source and drain regions 315 and 316 are formed a certain distance apart from the edge of the gate electrodes in the so-called offset structure as illustrated in FIG. 3(C).

The source and drain regions 315 and 316 may be formed by ion doping technique instead of the ion implantation. While large substrates can usually not be treated in the case of ion implantation technique, the ion doping apparatus can be utilized to treat relatively large substrates having 30 inches or larger diagonal dimensions. In the case of the ion doping technique, however, unnecessary ions such as hydrogen ions are also accelerated and introduced into the films so that the substrate temperature tends to substantially elevate, and therefore it is difficult to make use of photoresist masks for selective ion introduction.

Since, the crystallinity of the source and drain regions 315 and 316 is substantially damaged by the ion implantation to be substantially amorphous or polycrystalline close to amorphous, laser annealing is performed in order to recrystallize the source and drain regions with the gate electrodes 311 and 312 coated by the oxide films 313 and 314 as a mask. The condition of the laser annealing is described in Japanese Patent Applications Nos.Hei3-231188 and 238713. The structure is then coated with a silicon oxide interlayer film 319 deposited by RF plasma CVD. Appropriate contact holes are opened through the silicon oxide film 319, and the silicon oxide film 310 by photolithography to expose the source and drain regions 315 and 316. Finally, necessary wirings including source and drain electrodes 320 to 322 are formed in contact with the source and drain regions 315 and 316 through the contact holes by depositing and patterning an aluminum film.

The energy of the laser annealing is so high as to recrystallize the second semiconductor film 304 as well as the first semiconductor film 305 to form uniformly crystallized source and drain through the thickness of these films. In accordance with the second embodiment of the present invention, therefore, the thickness of the source and drain regions 316 and 315 is about 100 nm whereas the thickness of the channel regions just below the gate electrodes 312 and 311 is as small as about 10 nm since the first semiconductor film 304 remains amorphous irrespective of the laser annealing due to the existence of the gate electrodes. As a result, the sheet resistance of the source and drain regions 316 and 317 is decreased while the OFF current passing through the channel region is substantially limited. Furthermore, in this case, it is possible to avoid undesirable influence of interfacial states occurring between the semiconductor film and the underlying silicon oxide film and trapping states occurring within the underlying silicon oxide film. Namely, the semiconductor film 305 functioning as a channel region does not makes direct contact with the silicon oxide film 303 but makes indirect contact therewith only with the amorphous semiconductor film 304 therebetween which does not function as a channel. In accordance with experiments conducted by the inventors, undesirable influence did not appear unless the density of interfacial states between the silicon oxide film 303 and the amorphous semiconductor film 304 exceeded about $5 \times 10^{12} \text{cm}^{-2}$.

Referring now to FIGS. 4(A) to 4(E), a method of manufacturing complementary thin film insulated gate field effect transistors in accordance with a third embodiment of the present invention will be explained.

Figure 4A:
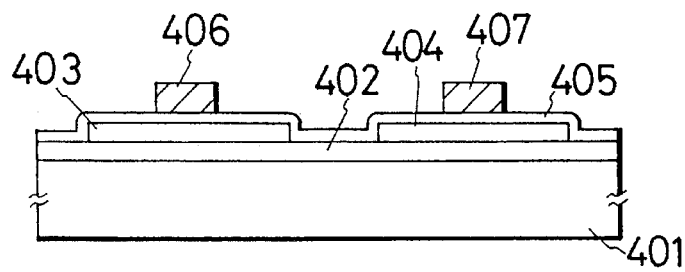
FIGS. 4(A) to 4(E) are cross sectional views showing a thin film insulated gate field effect transistor manufactured in accordance with a third embodiment of the present invention.

A non-expensive glass plate is used as a substrate 401. The glass plate is, for example, the N—O glass plate manufactured by Nippon Electric Glass Co., Ltd. A silicon oxide film 402 is formed on the substrate. The silicon oxide film 402 is deposited by plasma CVD or low pressure CVD to a thickness of 100 to 800 nm. An amorphous semiconductor film is deposited on the silicon oxide film 402 to a thickness of 20 to 100 nm by plasma CVD. The semiconductor film is then recrystallized by thermal annealing at 600° C. for 12 to 72 hours and patterned into a plurality of semiconductor islands 403 and 404 for n-channel and p-channel FETs respectively by photolithography and reactive ion etching (RIE). A silicon oxide film 405 is deposited to a thickness of 50 to 200 nm by sputtering in oxygen with a target of silicon oxide in order to form a gate insulating film. An aluminum film is formed on the silicon oxide film 405 by sputtering or electron beam evaporation and patterned by etching with a mixed acid prepared by adding a 5% nitric acid to phosphoric acid in order to form gate electrodes 406 and 407 and necessary wirings (not shown in the figure). By the above procedure, the indispensable elements of the transistors are provided on the substrate as illustrated in FIG. 4(A).

Figure 4B:
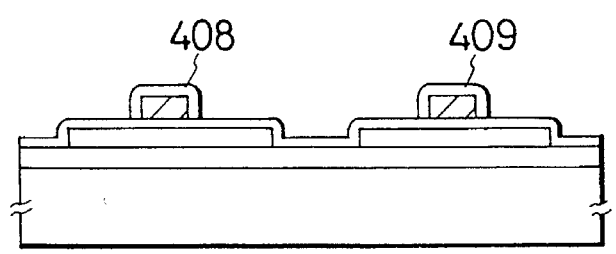

The external surfaces of the gate electrodes 406 and 407 and the wirings are then anodic oxidized in order to form aluminum oxide films 408 and 409 as illustrated in FIG. 4(B). Namely, the substrate is dipped in an electrolyte with the gate electrodes 406 and 407 and the wirings as an anode together with a suitable electrode dipped as a cathode. The details of the anoding method are described in Japanese Patent Application No.Hei4-30220. The actual configuration of the anoding system and the procedure of anoding will be determined in accordance with the characteristics desired of the transistors, the process requirements, the investment scale and so forth.

Figure 4C:
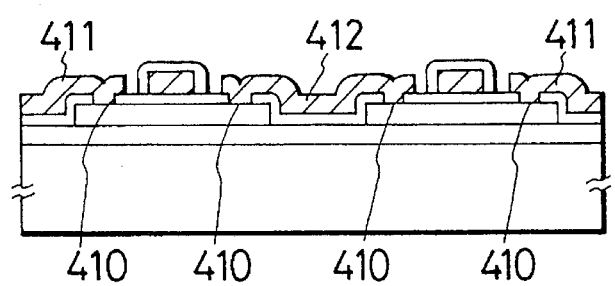

Contact holes are then opened through the silicon oxide film 405. A chromium film is deposited on the structure and patterned in order to provide electrodes 411 and 412 which make electric contact with the semiconductor islands 403 and 404 as illustrated in FIG. 4(C). A voltage of 30 to 100 V, preferably 35 to 50 V, is applied to the electrodes 411 respective to the electrodes 412 grounded in order to pass an electric current through the semiconductor islands 403 and 404 for an hour. The electric current causes self-heating and electro-migration to anneal the semiconductor islands. A negative voltage of −30 to −100 V, preferably −35 to −50 V, is applied to the gate electrodes 406 and 407 for an hour at the same time as the annealing by self-heating and electro-migration. Ultraviolet rays of 300 to 350 nm wavelength are radiated to the structure through the bottom surface of the substrate during the application of the negative voltage. The power density of the ultraviolet rays are, for example, 100 to 300 mW/cm². The electrons trapped and the lattice defects caused during the anoding are then eliminated by the application of the negative voltage in the same manner as in the previous embodiment. This advantage is enhanced by the irradiation of ultraviolet rays in this case.

Figure 4D:
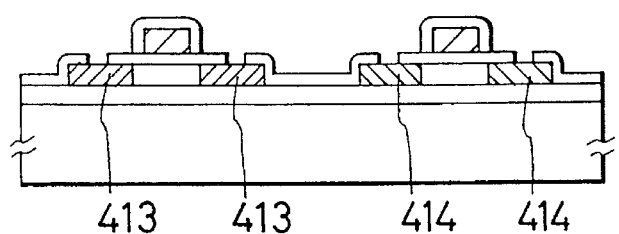
Figure 4E:
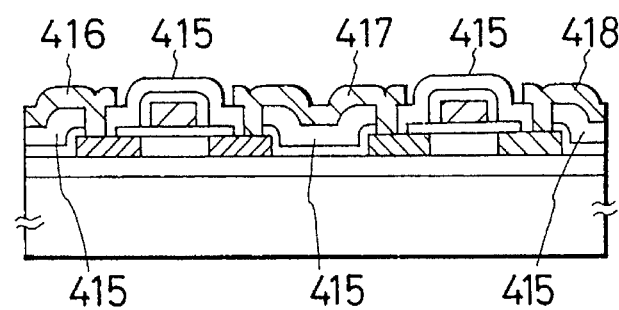
Figure 5A:
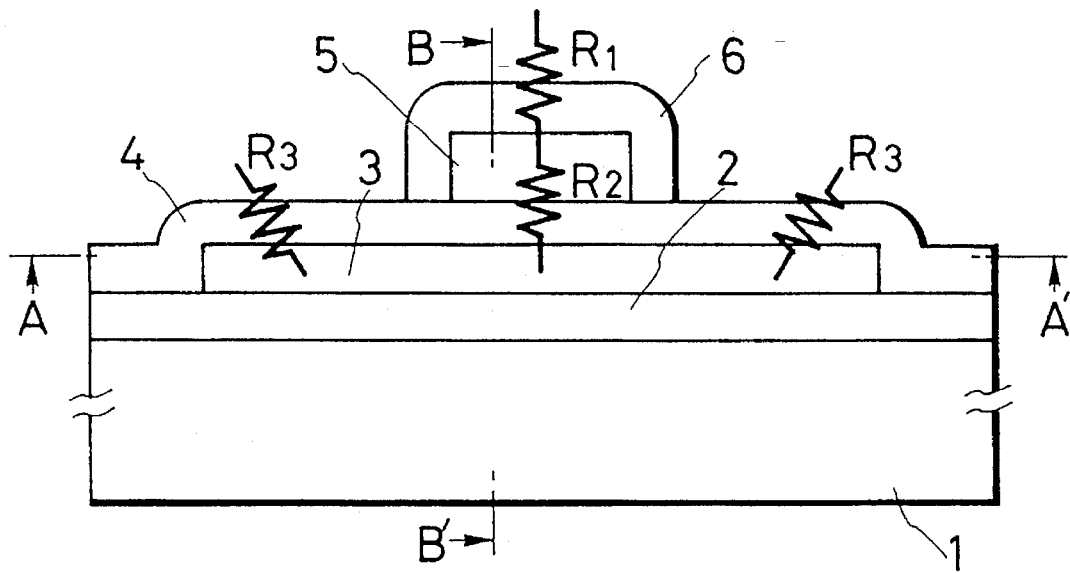
FIGS. 5(A) and 5(B) are schematic view of the present invention.
Figure 5B:
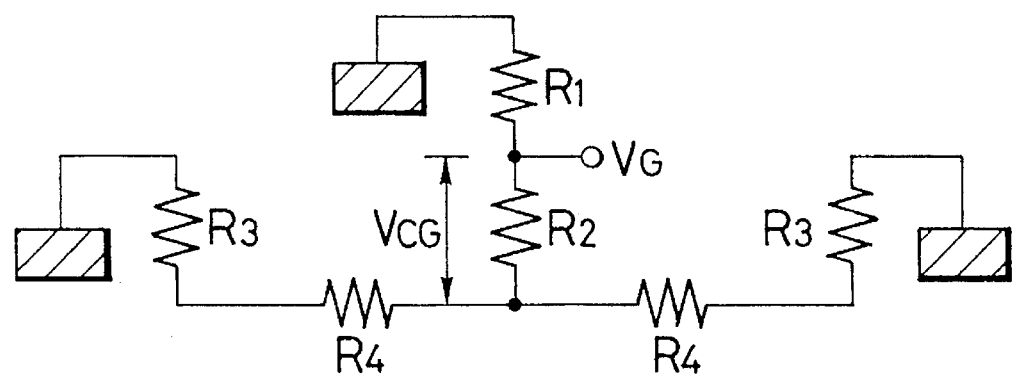
Figure 7A:
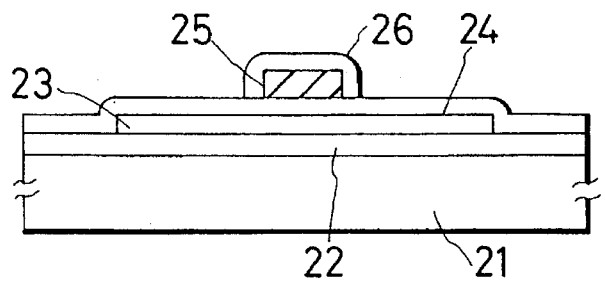
FIGS. 7(A) to 7(F) are cross sectional view showing formation process of the fifth embodiment.
Figure 7B:
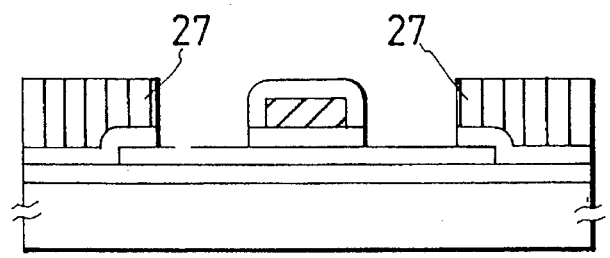
Figure 7C:
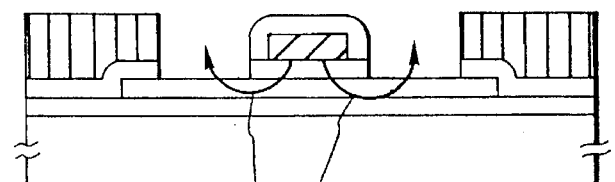
Figure 7D:
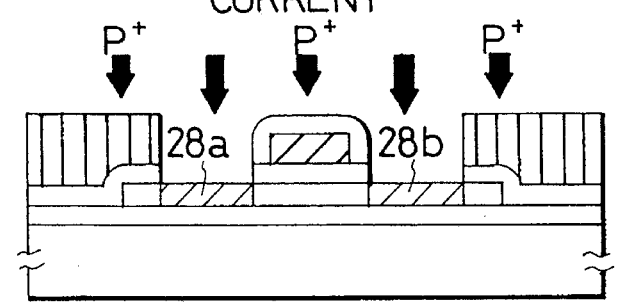
Figure 7E:
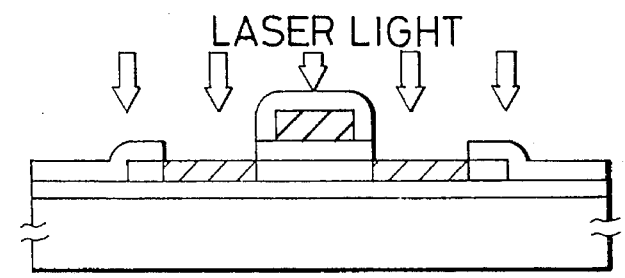
Figure 7F:
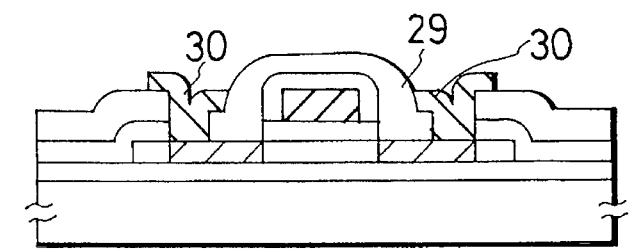
Figure 8A:
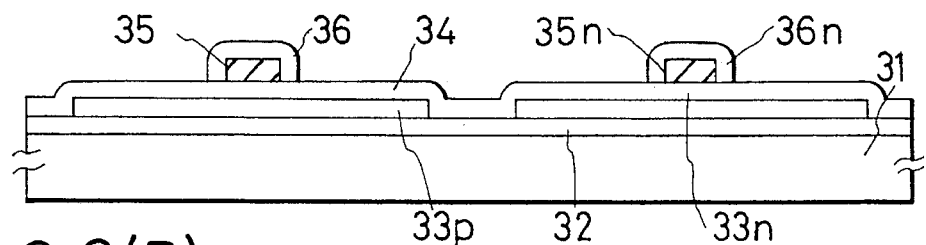
FIGS. 8(A) to 8(F) are cross sectional view showing formation process of the sixth embodiment.
Figure 8B:
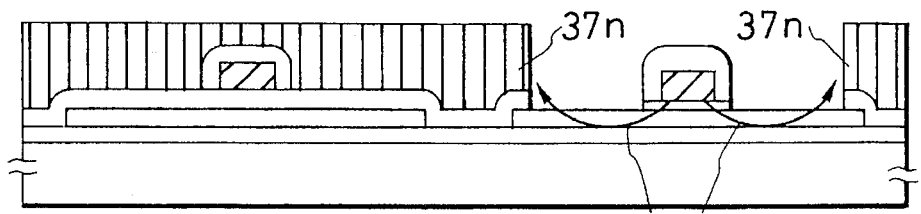
Figure 8C:
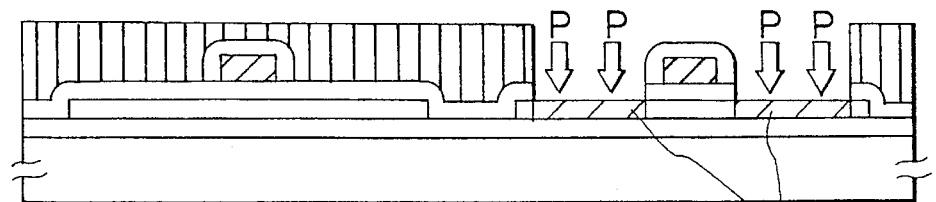
Figure 8D:
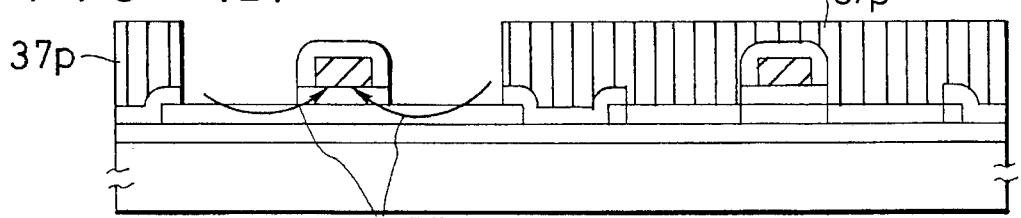
Figure 8E:
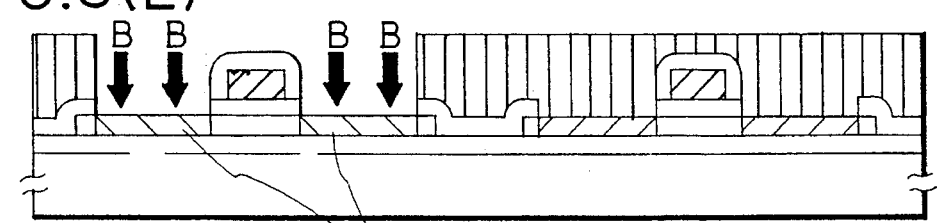
Figure 8F:
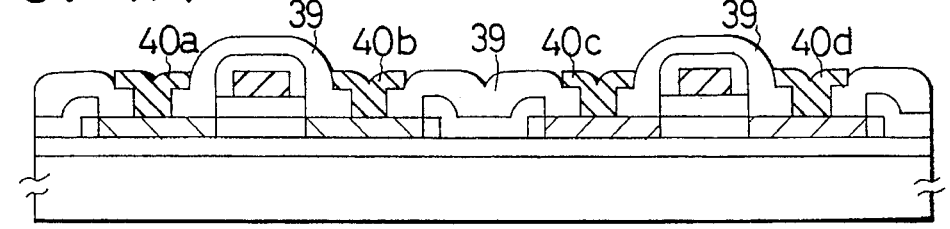
Figure 9A:
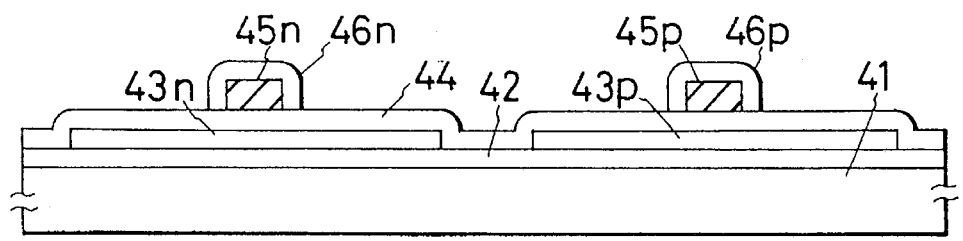
FIGS. 9(A) to 9(F) are cross sectional view showing formation process of the seventh embodiment.
Figure 9B:
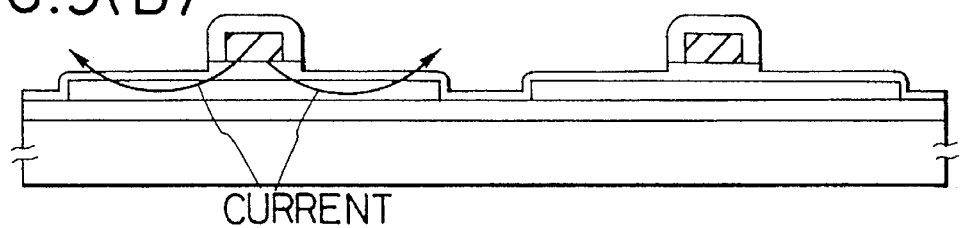
Figure 9C:
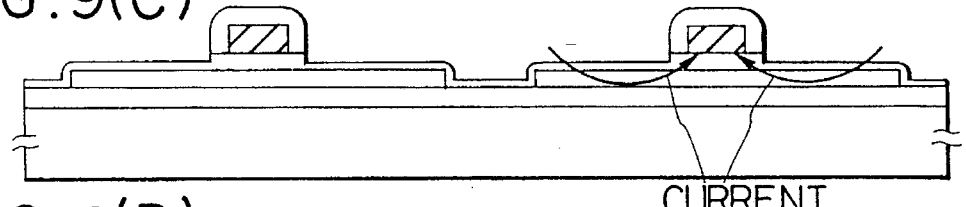
Figure 9D:
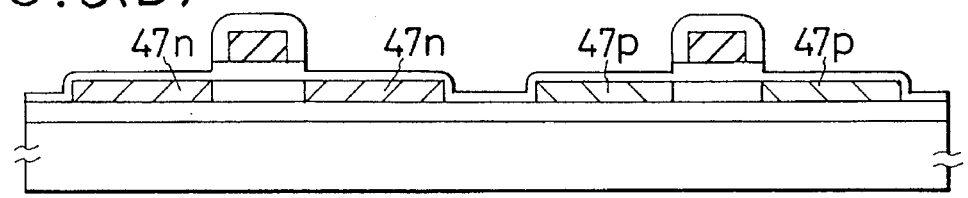
Figure 9E:
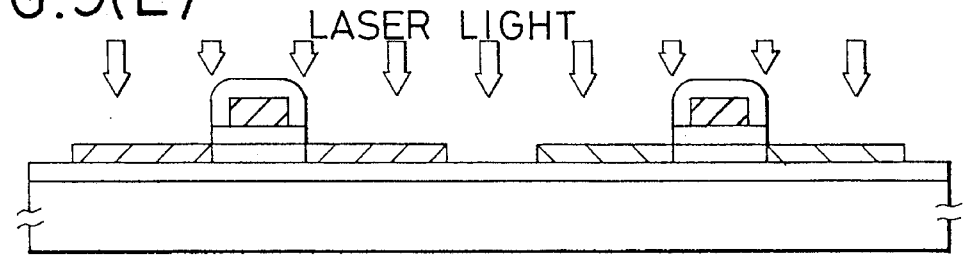
Figure 9F:
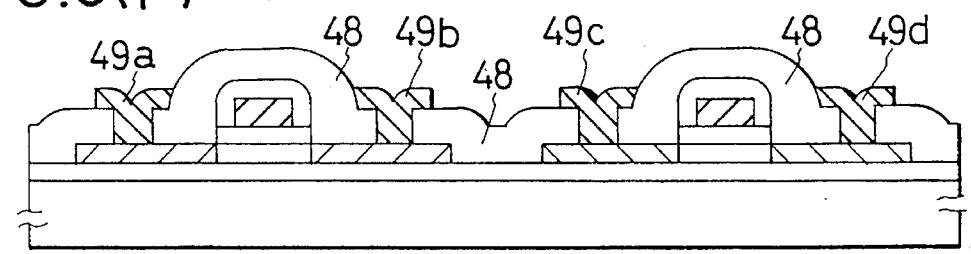

Next, source and drain regions 413 and 414 are formed within the semiconductor islands 403 and 404 by ion implantation in accordance with the known CMOS manufacturing technique. Namely, phosphorous ions are implanted into the semiconductor island 403 with 110 KeV while the gate electrode 406 and the aluminum oxide film 408 cover the middle portions of the semiconductor islands to be channel regions. Boron fluoride ions are implanted in the same manner into the semiconductor island 404 with 80 KeV. In the light of the aluminum oxide films 408 and 409, the source and drain regions 413 and 414 are formed a certain distance apart from the edge of the gate electrodes in the so-called offset structure as illustrated in FIG. 4(D).

Since, the crystallinity of the source and drain regions is substantially damaged by the ion implantation to be substantially amorphous or polycrystalline close to amorphous, laser annealing is performed in order to recrystallize the source and drain regions in the same manner as in the first embodiment. The condition of the laser annealing is described in Japanese Patent Application No.Hei4-30220. After the annealing, the substrate is annealed again in hydrogen (1 to 700 Torr, preferably 500 to 700 Torr) at 250° to 450° C. for 30 minutes to 3 hours. By this annealing in hydrogen, hydrogen atoms are introduced into the semiconductor regions and reduce lattice defects such as dangling bonds by termination.

The structure is then coated with a silicon oxide interlayer film 415 deposited by sputtering. Appropriate contact holes are opened through the silicon oxide film 415 and 405 by photolithography to expose the source and drain regions 413 and 414 and the gate wiring. Finally, necessary wirings including source and drain electrodes 417 and 418 are formed in contact with the source and drain regions through the contact holes by depositing and patterning an aluminum or chromium film.

Referring now to FIGS. 6(A) to 6(F), a method of manufacturing a semiconductor device in accordance with a fourth embodiment of the present invention will be explained. This embodiment is an example of manufacturing an N channel TFT. First of all, a bottom film 12 of silicon oxide of 2000 Å thickness is deposited on a substrate(Coning 7059)11 by a sputtering method. Furthermore, an intrinsic(I type) amorphous silicon film of 500–1500 Å thickness, for example 1500 Å thickness is deposited by a plasma CVD method and a silicon oxide film of 200 Å thickness is deposited on it by a sputtering method and the like. This amorphous silicon film is crystallized by annealing at 600° C. for 48 hours in nitrogen atmosphere.

After crystallization process, the silicon film was patterned, and an island silicon region 13 is formed. Then a silicon oxide film 14 with 1000 Å thickness is deposited as a gate insulating film by a sputtering method. Silicon oxide is utilized as a target in sputtering. Substrate temperature during sputtering is 200°–400° C., 250° C. for example. Sputtering atmosphere is oxygen and argon, and argon/oxygen=0–0.5, and 0.1 or less for example.

An aluminum film containing silicon by 0.5–3%, 2% for example is deposited by 1000–10000 Å thickness, 5000 Å for example. It is desirable to perform deposition of the silicon oxide film and the aluminum film in succession. This aluminum film is etched by mixed acid mainly comprising phosphoric acid, and a gate electrode 15 is formed.(FIG. 6(A))

The substrate is dipped in ethylene glycol solution of tartaric acid(1–5%, neutralized by ammonia). Positive voltage is applied to the gate electrode and current is run, and an anodic oxide film(aluminum oxide) 16 grows on the surface of the gate electrode. Electric potential of the gate electrode is increased at a rate of 2–5 V/minute, for example, at 4 V/minute to be 200–300 V, for example 250 V, and is kept as it is for two hours. It is preferable the thickness of the anodic oxide to be 1000–5000 Å, especially 2000–3000 Å. In this fourth embodiment it is made as 2500 Å.

A gate insulating film is etched only by 500 Å by dry etching. As etching gas, carbon tetrafluoride($CF_4$) is utilized.(FIG. 6(B)) The substrate is dipped in ethylene glycol solution of tartaric acid(1–5%, neutralized by ammonia). Positive voltage is applied to the gate electrode and current cure is performed. Because the gate electrode is positive, current is run in the direction of the arrows (FIG. 6(C)), and current cure of FIGS. 6(A), (B), and (C) is performed. Electric potential of the gate electrode is increased at first at a rate of 2–5 V/minute, for example at 4 V/minute to be 30–80 V, for example 60 V, and is kept as it is for an hour.(FIG. 6(C))

An impurity(phosphorus) is injected to a silicon region by plasma doping method utilizing the gate electrode and anodic oxide around it as a mask. Phosphine($PH_3$) is utilized as doping gas, and accelerating voltage is made as 60–90 kV, for example 80 kV. Dose amount is made as $1\times10^{15}$–$8\times10^{15}cm^{-2}$, for example, $2\times10^{15}cm^{-2}$. As a result, N type impurity regions 17a and 17b are formed. As is apparent from the figure, this impurity region 17 and the gate electrode are in offset condition, and are not overlapped with each other geometrically.(FIG. 6(D))

After that, laser light is irradiated, and laser annealing is performed. As laser, KrF excimer laser(wavelength 248 nm, pulse width 20 nsec) is utilized. Other kinds of laser such as XeF excimer laser(wavelength of 353 nm), XeCl excimer laser(wavelength of 308 nm), ArF excimer laser(wavelength of 193 nm) can be utilized. Energy density of laser is 200–500 mJ/cm$^2$, for example 250 mJ/cm$^2$. 2–10 shots at a place, for example, 2 shots are irradiated. During laser irradiation, the substrate is heated at 100°–450° C., for example, 250° C. In this way, impurities are activated.(FIG. 6(E))

A silicon oxide film 18 of 6000 Å thickness is formed as interlayer insulator by a plasma CVD method. Contact holes are formed therein, and electrode.wiring 19a, 19b of a source region and a drain region of a TFT are formed of a metal layer, e.g. a multilayer of a titanium nitride layer and an aluminum layer. Finally, annealing is performed in hydrogen atmosphere of 1 atmospheric pressure at 350° C. for 30 minutes. A thin film transistor is formed by this process.(FIG. 6(F))

Field effect mobility of the thin film transistor formed here is 70–100 cm$^2$/Vs by gate voltage of 10 V, threshold is 2.5–4.0 V, and leak current is $10^{-13}$A or less when voltage of $-20$ V is applied to the gate.

Because this embodiment is related to manufacturing of an N channel TFT, positive voltage is applied in the process of current cure. In the manufacturing process of a P channel TFT, negative voltage of the equal level, that is, $-30$ to $-80$ V should be applied.

Referring now to FIGS. 7(A) to 7(F), a method of manufacturing a semiconductor device in accordance with a fifth embodiment of the present invention will be explained. A base film 22 of silicon oxide of 2000 Å thickness is formed on a substrate(Coning 7059) 21 by a sputtering method. Furthermore, by a plasma CVD method, an intrinsic(I type) amorphous silicon film of 200–1500 Å thickness, for example, 500 Å is deposited by a plasma CVD method. By patterning this silicon film, an island silicon film 23 is formed. A silicon region is crystallized by laser annealing. KrF excimer laser(wavelength of 248 nm) is utilized as laser. Energy density of laser is made as 200–500 mJ/cm$^2$, for example 350 mJ/cm$^2$, and 2–10 shot, for example 2 shots at a place is irradiated. During laser irradiation, the substrate is heated at 100°–450° C., for example, 350° C.

Silicon oxide 24 of 1000 Å thickness is formed from material of tetra-ethoxy-silane($Si(OC_2H_5)_4$, TEOS) and oxygen as a gate insulating film of a crystal silicon TFT by a plasma CVD method. As the material, trichloroethylene($C_2HCl_3$) is utilized in addition to above mentioned gas. Oxygen is flown into the chamber by 400 SCCM before deposition, and plasma is produced at substrate temperature of 300° C., total pressure of 5 Pa, and RF power of 150 W. This condition is kept for 10 minutes. After that, oxygen of 300 SCCM, TEOS of 15 SCCM, trichloroethylene of 2 SCCM is introduced to the chamber, and a silicon oxide film is deposited. Substrate temperature, RF power, total pressure is 300° C., 75 W, and 5 Pa respectively. After deposition, hydrogen of 100 Torr is introduced into the chamber, and hydrogen annealing is performed at 350° C. for 35 minutes.

An aluminum film containing silicon by 0.5–3%, for example 2%, is deposited by 1000–10000 Å, for example, 5000 Å. The aluminum film is etched by mixed acid mainly comprising phosphoric acid, and a gate electrode 25 is formed.

The substrate is dipped in an ethylene glycol solution(1–5%, neutralized by ammonia) of tartaric acid, and current is passed through the gate electrode and an anodic oxide (aluminum oxide) layer 26 is formed on the surface of the gate electrode. It is preferable the thickness of anodic oxide is 1000–5000 Å, especially 2000–3000 Å. In this fifth embodiment it is 2500 Å.(FIG. 4(A))

A mask 27 is formed by photoresist, and a part of the semiconductor region of a TFT is exposed. The silicon oxide film 24 is etched with this mask. 10% hydrofluoric acid is utilized as an etchant.(FIG. 7(B))

In general, it is technically impossible to uniformly etch a silicon oxide film as shown in the fourth embodiment, in the case of a large-area substrate. Thick parts and thin parts are produced in the silicon oxide film. Such silicon oxide film causes disparity of voltage applied to the silicon oxide film(gate insulating film) under the gate electrode, and is not preferable. The method of this fifth embodiment is preferable because it does not have this problem.

Figure 10A:
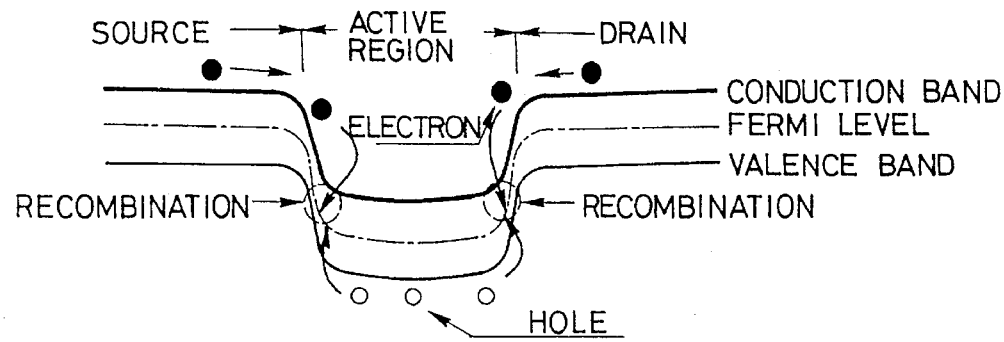
Figure 10B:
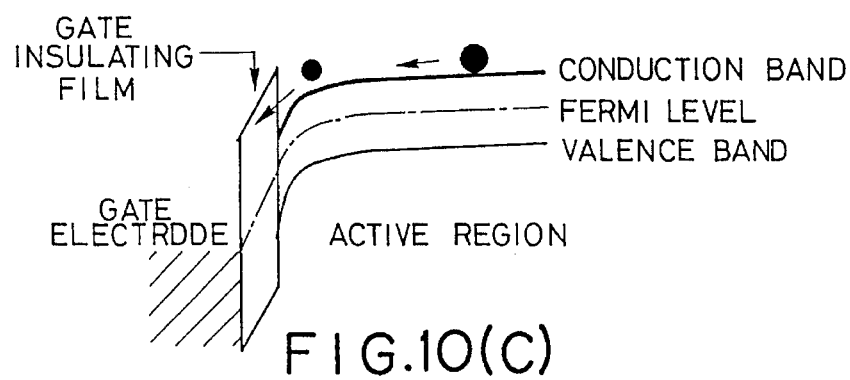
Figure 10C:
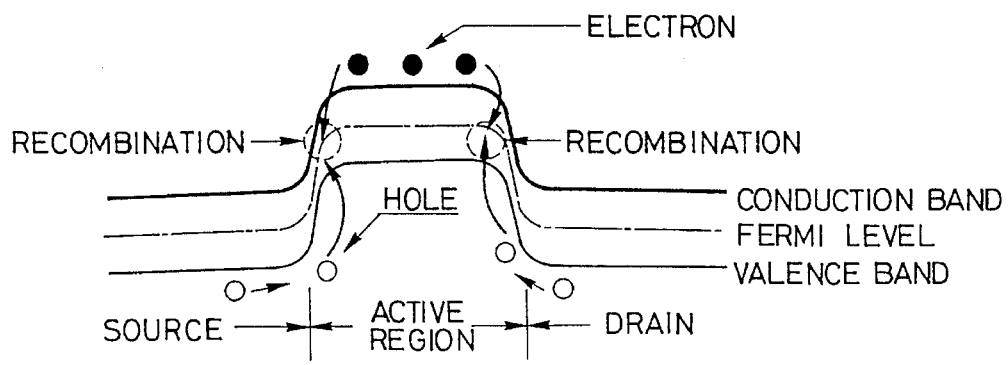
Figure 10D:
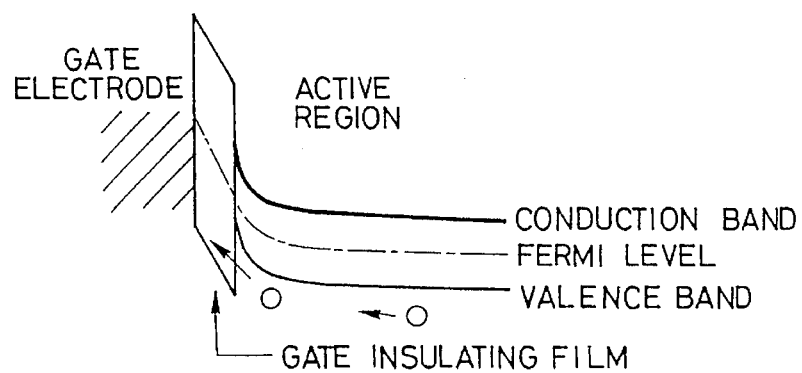
Figure 11A:
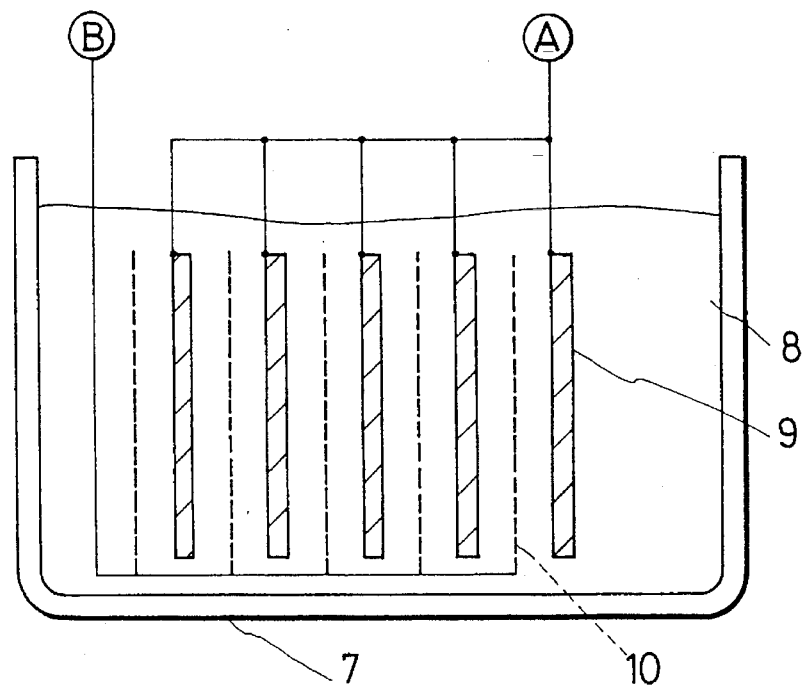
FIGS. 11(A) and 11(B) illustrate an apparatus for performing current cure.
Figure 11B:
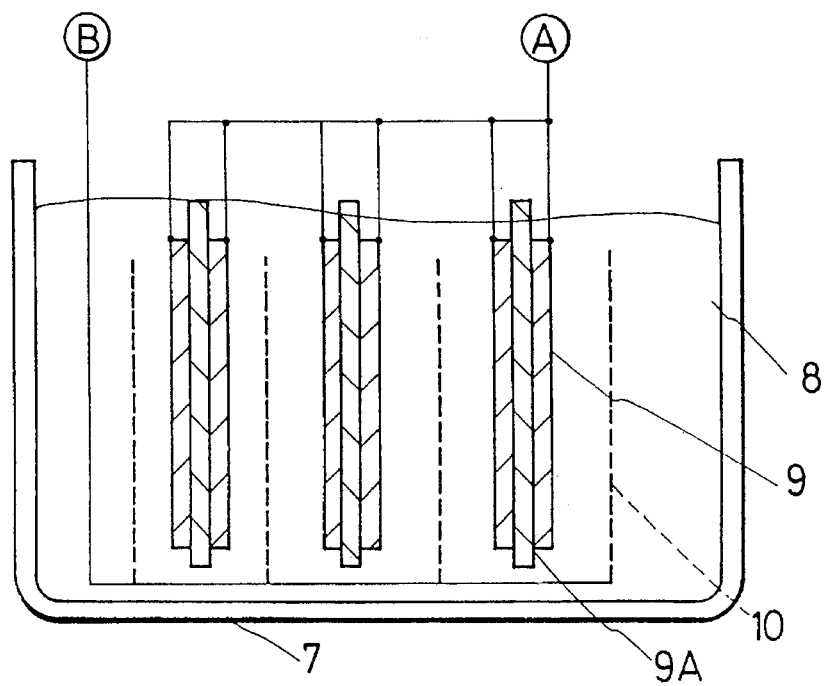

The substrate is dipped in an ethylene glycol solution(1–5%, neutralized by ammonia) of tartaric acid, and current cure is performed by applying positive voltage to the gate electrode. By passing current in the silicon film, especially in the channel formation region(active region), process of current cure is produced as in FIGS. 10(A) and 10(B). In this way, the channel formation region, especially recombination centers of the interface of the insulating film and silicon film are neutralized and removed in a portion thereof to pinch off. Electric potential of the gate electrode is increased at a rate of 2–5 V/minute at first, for example 4 V/minute, and increased as 30–80 V, for example 60 V. It was kept as it is for an hour.(FIG. 7 (C))

By a plasma doping method, an impurity(phosphorus) is injected to the silicon region using the gate electrode and the peripheral anodic oxide as a mask. Phosphine($PH_3$) is utilized as a doping gas, and accelerating voltage is made as 60–90 kV, for example, 80 kV. Dose amount is made as $1\times10^{15}$–$8\times10^{15}cm^{-2}$, for example, $2\times10^{15}cm^{-2}$. As a result, N type impurity regions 28a and 28b are formed.(FIG. 7(D))

After that, laser light is irradiated and laser annealing is performed. As laser, KrF excimer laser(wavelength 248 nm, pulse width 20 nsec) is utilized. Energy density of laser is 200–500 mJ/cm$^2$, for example 250 mJ/cm$^2$. 2–10 shots at a place, for example, 2 shots are irradiated. During laser irradiation, the substrate is heated at 100°–450° C., for example, 250° C. In this way, the impurity is activated.(FIG. 7(E))

A silicon oxide film 29 of 6000 Å thickness is formed by a plasma CVD method as an interlayer insulator. Contact holes are made in this, and electrode.wiring 30a and 30b of a source region and a drain region of a TFT is made from a metal layer, e.g. a multilayer of a titanium nitride film and an aluminum film. Finally, annealing is performed in hydrogen atmosphere of 1 atmospheric pressure at 350° C. for 30 minutes. By this process, a thin film transistor is formed.(FIG. 7(F))

Referring now to FIGS. 8(A) to 8(F), a method of manufacturing a semiconductor device in accordance with a sixth embodiment of the present invention will be explained. This embodiment is an example of forming complementary TFTs(CTFT) comprising an N channel TFT and a P channel TFT formed on the same substrate. First of all, a base film 32 of silicon oxide of 2000 Å thickness is formed on a substrate(Coning 7059) 31 by a sputtering method. An intrinsic(I type) amorphous silicon film of 500–1500Å, for example, 1500 Å thickness is formed by a plasma CVD method, and a silicon oxide film of 200 Å thickness is formed by a sputtering method. This amorphous silicon film is crystallized in a nitrogen atmosphere at 600° C. by annealing of 48 hours.

After crystallization process, the silicon film was patterned, and island silicon regions 33p(for a P channel TFT) and 33n(for an N channel TFT) are formed. Then a silicon oxide film 34 with 1000 Å thickness is deposited as a gate insulating film by a sputtering method. Silicon oxide is utilized as a target in sputtering. Substrate temperature during sputtering is 200°–400° C., 250° C. for example. Sputtering atmosphere is oxygen and argon, and argon/oxygen=0–0.5, and 0.1 or less for example.

An aluminum film containing silicon by 0.5–3%, 2% for example is deposited by 1000–10000 Å thickness, 5000 Å for example. It is desirable to perform deposition of the silicon oxide film and the aluminum film in succession. This aluminum film is etched by mixed acid mainly comprising phosphoric acid, and gate electrodes 35p(for a P channel TFT) and 35n(for an N channel TFT) are formed.

The substrate is dipped in ethylene glycol solution of tartaric acid(1–5%, neutralized by ammonia). Positive voltage is applied to the gate electrode and anodic oxide(aluminum oxide) layers 36p and 36n are deposited on the surface of each gate electrode. The thickness of anodic oxide is 2500 Å.(FIG. 8(A))

A mask 37n is formed by photoresist, and a semiconductor region of an N channel TFT 33n is exposed. The silicon oxide 34 is etched by utilizing this mask. As an etchant, 10% hydrofluoric acid is utilized. The substrate is dipped in ethylene glycol solution of tartaric acid(1–5%, neutralized by ammonia) again, and positive voltage is applied to perform current cure to the gate electrode. Electric potential of the gate electrode is increased at a rate of 4 V/minute to be 30–80 V, for example, 60 V. It is kept as it is for an hour.

In this case, voltage is applied to the gate electrode of the P channel type TFT, but because the entire portion is covered with insulating material, specific voltage is not applied to the insulating film under the gate electrode. That means current cure is not performed to the P-channel type TFT in this process. This is appropriate for a P channel TFT, because characteristic of it is deteriorated if positive voltage is applied to the gate insulating film.(FIG. 8(B))

Impurity(phosphorus) is injected to a silicon region 33n of an N channel TFT by using a mask 37n, a gate electrode 35n, and anodic oxide 36 around it as a mask. Phosphine($PH_3$) is utilized as a doping gas, and accelerating voltage is 60–90 kV, for example, 80 kV. The dose amount is $1\times10^{15}$–$8\times10^{15}cm^{-2}$, for example, $2\times10^{15}cm^{-2}$. As a result, an N type impurity region 38n is formed.(FIG. 8(C))

The N channel TFT is covered with a mask 37p by photoresist, and a semiconductor region 33p of a P channel TFT is exposed. With this mask, a silicon oxide film 34 is etched. 10% hydrofluoric acid is utilized as an etchant. The substrate is dipped again in ethylene glycol solution of tartaric acid(1–5%, neutralized by ammonia). Current cure is performed to the gate electrode by applying negative voltage to the gate electrode. Electric potential of the gate electrode is increased at a rate of –4 V/minute at first as –30 to –80 V, for example –60 V, and is kept as it is for an hour.

Voltage is applied to the gate electrode of an N channel type TFT also in this case. Because the entire portion is covered with insulating material, specific voltage is not applied to the insulating film under the gate electrode.(FIG. 8(D))

Impurity(boron) is injected to a silicon region 33p of a P channel TFT by using a mask 37p, a gate electrode 35p, and anodic oxide 36p around it as a mask, by a plasma doping method. Diborane($B_2H_6$) is utilized as a doping gas, and accelerating voltage is 40–80 kV, for example, 65 kV. The dose amount is $1\times10^{15}$–$8\times10^{15}cm^{-2}$, for example $5\times10^{15}cm^{-2}$. As a result, P type impurity region 38p is formed.(FIG. 8(E))

After that, laser light is irradiated, and laser annealing is performed. KrF excimer laser(wavelength 248 nm, pulse width 20 nsec) is utilized as laser. Energy density of laser is 200–500 mJ/cm$^2$, for example, 250 mJ/cm$^2$. 2–10 shots at a place, for example, 2 shots are irradiated. The substrate is heated at 100°–450° C., for example, 250° C. In this way, impurity is activated.

A silicon oxide film 39 of 6000 Å thickness is formed as an interlayer insulator by a plasma CVD method, Contact holes are formed in this, an electrode.wiring 40a, 40b, 40c, and 40d of source region and drain region of a TFT are formed of a metal film, e.g. a multilayer of a titanium nitride film and an aluminum film. Finally, annealing is performed in hydrogen atmosphere of 1 atmospheric pressure at 350° C. for 30 minutes. By this process, a thin film transistor is formed.(FIG. 8(F))

A shift resistor is formed by utilizing the thin film transistor formed here. Operation of 11 MHz at drain voltage of 15 V, 20 MHz at the voltage of 18 V is confirmed.

If current cure is performed to a CTFT as this embodiment, gate electrodes of a P channel TFT and an N channel TFT should be separately provided, and voltage should be applied to each independently. However, in the case of the circuit of a CTFT in many cases gate electrodes of an N channel TFT and a P channel TFT are connected. If voltage supply in different systems like this is performed, pattern to connect them later is needed.

On the other hand, in the present invention, such problem is solved by the mask 37p and the mask 37n. Such mask as these is actually a doping mask, too, and the number of manufacturing process will not increase.

Referring now to FIGS. 9(A) to 9(F), a method of manufacturing a semiconductor device in accordance with a seventh embodiment of the present invention will be explained. This embodiment is an example of forming a CTFT. A base film 42 of silicon oxide of 2000 Å thickness is formed on a substrate (Coning 7059) 41 by a sputtering method. An intrinsic(I type) amorphous silicon film of 500–1500 Å thickness, for example, 1500 Å thickness is deposited by a plasma CVD method. On it, a silicon oxide film of 2000 Å thickness is deposited by a sputtering method. This amorphous silicon film is crystallized by annealing in a nitrogen atmosphere at 600° C. for 48 hours.

After crystallization process, a silicon film is patterned, and island silicon regions 48n(for an N channel TFT) and 43p(for a P channel TFT) are formed, and a silicon oxide film 44 of 1000 Å thickness is formed by a sputtering method. An aluminum film containing silicon by 0.5–3%, for example 2%, is deposited by 1000–10000 Å thickness, for example, 5000 Å. The aluminum film is etched, and a gate electrode 45n(for an N channel TFT) and 45p(for a P channel TFT) are formed.

The substrate is dipped in ethylene glycol solution of tartaric acid(1–5%, neutralized by ammonia). Current is passed through the gate electrode by applying positive voltage, and anodic oxide(aluminum oxide) films 46n and 46p are grown on the surface of the gate electrode. The thickness of anodic oxide is 1000–5000 ÅA, preferably 2000–3000 Å. It is 2500 Å in this seventh embodiment.(FIG. 9(A))

The gate insulating film is etched by only 500 Å by dry etching. Carbon tetrafluoride($CF_4$) is utilized as etching gas. The substrate is dipped in an ethylene glycol solution of tartaric acid(1–5%, neutralized by ammonia), and current cure is performed to 45n of the gate electrode by applying positive voltage. Electric potential of the gate electrode is increased at first at a rate of 2–5 V/minute, for example, 4 V/minute, and risen to 30–80 V, for example, 60 V, and is kept as it is for an hour. Electric potential of the other gate electrode 45p is 0. As a result, current cure is performed to only the N channel TFT.(FIG. 9(B))

Negative voltage is applied to the other gate electrode 45p to perform current cure. Electric potential of the gate electrode is increased at first at a rate of −2 to −5 V/minute, for example, −4 V/minute, and is risen to −30 to −80 V, for example, −60 V. It is kept as it is for an hour. Electric potential of the gate electrode 45n is 0. As a result, current cure is performed to both TFTs.(FIG. 9(C))

Impurity(phosphorous and boron) is injected to the silicon region by utilizing the conventional CMOS formation technology by a plasma doping method. The dose amount of phosphorous is $2\times10^{15}cm^{-2}$, and that of boron is $5\times10^{15}cm^{-2}$. As a result an N type impurity region 47n and a P type impurity region 47p are formed.(FIG. 9(D))

After that, laser light is irradiated and laser annealing is performed. KrF excimer laser(wavelength 248 nm, pulse width is 20 nsec) is utilized as laser. Energy density of laser is 200–500 mJ/$cm^2$, for example 250 mJ/$cm^2$. 2–10 shot at a place, for example 2 shots are irradiated. The substrate is heated at 100°–450° C., for example 250° C. during laser irradiation. In this way, impurity is activated.(FIG. 9(E))

A silicon oxide film 48 of 6000 Å thickness is formed as an interlayer insulator by a plasma CVD method. Contact holes are formed in this, and electrode.wiring 49a, 49b, 49c, and 49d of source region and drain region of a TFT are formed by a metal layer, e.g. a multilayer of a titanium nitride film and an aluminum film. Finally, annealing is performed in hydrogen atmosphere of 1 atmospheric pressure at 350° C. for 30 minutes. By this process, a TFT circuit of CMOS(CTFT) is achieved.(FIG. 9(F))

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of manufacturing an insulated gate field effect transistor comprising a step of forming a semiconductor region on an insulating substrate;

a step of forming an insulating film functioning as a gate insulating film on said semiconductor region:

a step of forming on said insulating film a conductive film made of one of aluminum, chromium, titanium, tantalum and silicon or an alloy of at least one of these metals or a multi-layer thereof;

a step of forming an oxide film covering a surface of said conductive film by applying a positive voltage to said conductive film in an electrolyte: and a step of applying a negative or positive voltage to said conductive film after said positive voltage application step to reform said semiconductor region or an interface of said semiconductor region and said insulating film, wherein an electric current is passed through said semiconductor region at the same time as said negative or positive voltage applying step.

2. A method of manufacturing an insulated gate field effect transistor comprising a step of forming a semiconductor region on an insulating substrate.

a step of forming an insulating film functioning as a gate insulating film on said semiconductor region, a step of forming on said insulating film a conductive film made of one of aluminum, chromium, titanium, tantalum and silicon or an alloy of at least one of these metals or a multi-layer thereof, a step of forming an oxide film covering a surface of said conductive film by applying a positive voltage to said conductive film in an electrolyte; and a step of applying a negative voltage to said conductive film after said positive voltage application step to reform said semiconductor region or an interface of said semiconductor region and said insulating film, wherein an ultraviolet light is irradiated to a rear surface of said substrate during the application of the negative voltage.

3. A method of manufacturing an insulated gate field effect transistor comprising a step of forming a semiconductor region on an insulating substrate; a step of forming an insulating film functioning as a gate insulating film on said semiconductor region; a step of forming on said insulating film a conductive film made of one of aluminum, chromium, titanium, tantalum and silicon or an alloy of at least one of these metals or a multi-layer thereof and a step of forming an oxide film on a surface of said conductive film by alternately applying a positive voltage and a negative voltage to said conductive film in an electrolyte.

4. A method for forming a semiconductor device comprising the following sequential steps:

forming a semiconductor island on a substrate;

forming an insulating film on said semiconductor island;

forming a gate electrode on said insulating film;

forming an anodic oxide coating on a surface of said gate electrode anodizing said gate electrode;

removing at least an upper portion of said insulating film except for a portion which is covered by said gate electrode and said anodic oxide coating;

applying a voltage to said gate electrode with the substrate being immersed in an electrolyte after said removing step; and doping an impurity into said semiconductor island after said applying step, wherein said voltage is negative, and a P-channel transistor is formed by said doping step.

5. The method of claim 4 wherein said insulating film is removed to a depth equal to the thickness thereof by said removing step.

6. The method of claim 4 wherein said electrolyte is maintained at room temperature or cooled during said applying step.

7. The method of claim 4 wherein a voltage of negative thirty to negative eighty volts is applied to said insulating film by said applying step.

8. The method of claim 4 wherein said gate electrode comprises a material selected from the group consisting of aluminum, tantalum, silicon, titanium, tungsten and chromium.

9. The method of claim 4 wherein said anodic oxide has a thickness of 100 to 5000 Å.

10. A method for forming a semiconductor device comprising:

forming at least two semiconductor islands on a substrate;

forming an insulating film over said semiconductor islands;

forming gate electrodes on said insulating film and respectively on said semiconductor islands;

forming anodic oxide films on surfaces of said gate electrodes by supplying current to said gate electrodes with said gate electrodes as anodes and with said substrate being immersed in an electrolyte;

coveting an entire surface of at least one of said semiconductor islands with an insulating material:

removing at least a portion of the insulating film with said insulating material as a mask;

applying a voltage to said gate electrodes with said substrate being immersed in said electrolyte after said removing step;

doping an impurity into at least one of said semiconductor islands with said insulating material as a mask; and removing said insulating material, wherein said voltage is negative, and a P-channel transistor is formed by said doping step.

11. The method of claim 10 wherein said electrolyte is maintained at room temperature or cooled during said applying step.

12. The method of claim 10 wherein a voltage of negative thirty to negative eighty volts is applied to said insulating film by said applying step.

13. The method of claim 10 wherein said gate electrodes comprise a material selected from the group consisting of aluminum, tantalum, silicon, titanium, tungsten and chromium.

14. A method of manufacturing an insulated gate field effect transistor comprising a step of forming a semiconductor island on an insulating substrate; a step of forming an insulating film functioning as a gate insulating film on said semiconductor island; a step of forming on said insulating film a gate electrode comprising an anodizable material, a step of forming an oxide film covering a surface of said gate electrode by applying a positive voltage to said gate electrode in an electrolyte, and a step of making a current flow from said gate electrode to said electrolyte through said gate insulating film and said semiconductor island after said oxide film forming step with said substrate being provided in said electrolyte to reform said semiconductor island or an interface of said semiconductor island and said insulating film, and a step of doping an impurity into said semiconductor island in order to form source or drain therein.

15. A method of manufacturing an insulated gate field effect transistor comprising a step of forming a semiconductor island on an insulating substrate; a step of forming an insulating film functioning as a gate insulating film on said semiconductor island; a step of forming on said insulating film a gate electrode comprising an anodizable material, a step of forming an oxide film covering a surface of said gate electrode by applying a positive voltage to said gate electrode in an electrolyte, and a step of making a current flow from said electrolyte to said gate electrode through said gate insulating film and said semiconductor island after said oxide film forming step with said substrate being provided in said electrolyte to reform said semiconductor island or an interface of said semiconductor island and said insulating film, and a step of doping an impurity into said semiconductor island in order to form source or drain therein.

16. A method for manufacturing a semiconductor device comprising the steps of:

preparing a wiring on a surface, said wiring comprising an anodizable conductive material;

putting said wiring into an electrolyte; and applying a voltage to said wiring in said electrolyte in order to form an anodic oxide film on a surface of said wiring, wherein said voltage is an alternating voltage, wherein said alternating voltage is a voltage that sequentially changes between a positive level and a negative level.

17. The method of claim 1 wherein said negative voltage applying step is carried out in said electrolyte.

18. The method of claim 2 wherein said negative or positive voltage applying step is carried out in said electrolyte.

* * * * *